United States Patent
Horiuchi et al.

(10) Patent No.: US 9,373,587 B2
(45) Date of Patent: Jun. 21, 2016

(54) STACKED ELECTRONIC DEVICE

(71) Applicant: SHINKO ELECTRIC INDUSTRIES CO., LTD., Nagano-shi (JP)

(72) Inventors: Michio Horiuchi, Nagano (JP); Ryo Fukasawa, Nagano (JP); Yuichi Matsuda, Nagano (JP); Yasue Tokutake, Nagano (JP)

(73) Assignee: SHINKO ELECTRIC INDUSTRIES CO., LTD., Nagano-shi (JP)

( * ) Notice: Subject to any disclaimer, the term of this patent is extended or adjusted under 35 U.S.C. 154(b) by 147 days.

(21) Appl. No.: 14/260,588

(22) Filed: Apr. 24, 2014

(65) Prior Publication Data

US 2014/0347833 A1 Nov. 27, 2014

(30) Foreign Application Priority Data

May 27, 2013 (JP) .................................. 2013-110634

(51) Int. Cl.
*H05K 1/18* (2006.01)
*H01L 23/538* (2006.01)
*H01L 23/00* (2006.01)
*H01L 25/10* (2006.01)

(52) U.S. Cl.
CPC ........ *H01L 23/5386* (2013.01); *H01L 23/5389* (2013.01); *H01L 24/00* (2013.01); *H01L 25/105* (2013.01); *H01L 2224/16225* (2013.01); *H01L 2225/1035* (2013.01); *H01L 2225/1058* (2013.01); *H01L 2225/1082* (2013.01); *H01L 2225/1088* (2013.01); *H01L 2924/12042* (2013.01); *H01L 2924/181* (2013.01); *H01L 2924/351* (2013.01)

(58) Field of Classification Search
CPC .......................... H01L 25/105; H01L 23/3128
USPC .......... 361/770–790; 257/685–686, 723–730, 257/787–790; 174/520–525, 259–264
See application file for complete search history.

(56) References Cited

U.S. PATENT DOCUMENTS

| | | | |
|---|---|---|---|
| 5,608,265 A * | 3/1997 | Kitano | H01L 21/565 257/685 |
| 6,180,881 B1 * | 1/2001 | Isaak | H01L 25/105 174/524 |
| 6,188,127 B1 | 2/2001 | Senba | |
| 7,242,081 B1 * | 7/2007 | Lee | H01L 25/0657 257/686 |

(Continued)

FOREIGN PATENT DOCUMENTS

| | | |
|---|---|---|
| JP | H08-236694 | 9/1996 |
| JP | 2002-43506 A1 | 2/2002 |

*Primary Examiner* — Tuan T Dinh
(74) *Attorney, Agent, or Firm* — Kratz, Quintos & Hanson, LLP

(57) ABSTRACT

An electronic component device, includes, a plurality of wiring layers including a component connection pad in a center part and an external connection pad in a periphery, an insulating layer formed on the wiring layers, and the insulating layer in which the component connection pad and the external connection pad are exposed, a frame member arranged on the insulating layer, and the frame member in which an opening portion is provided in an area of the center part in which the component connection pad is arranged, and a connection hole is provided on the external connection pad, an electronic component arranged in the opening portion of the frame member and connected to the component connection pad, a sealing resin formed in the opening portion of the frame member and sealing the electronic component, and a metal bonding material formed on the external connection pad in the connection hole.

7 Claims, 13 Drawing Sheets

(56) References Cited

U.S. PATENT DOCUMENTS

| | | | | |
|---|---|---|---|---|
| 8,304,900 B2 * | 11/2012 | Jang | ................... | H01L 23/3128 257/733 |
| 8,525,318 B1 * | 9/2013 | Kim | ................... | H01L 23/3128 257/686 |
| 2001/0054758 A1 * | 12/2001 | Isaak | ................... | H01L 25/0657 257/686 |
| 2005/0098879 A1 * | 5/2005 | Kim | ........................ | H01L 23/13 257/712 |
| 2010/0072598 A1 * | 3/2010 | Oh | ........................ | H01L 25/105 257/686 |

\* cited by examiner (reduced plan view)

(reduced plan view)

(reduced plan view)

electroplating

STACKED ELECTRONIC DEVICE

CROSS-REFERENCE TO RELATED APPLICATIONS

This application is based upon and claims the benefit of priority of the prior Japanese Patent Application No. 2013-110634, filed on May 27, 2013, the entire contents of which are incorporated herein by reference.

FIELD

This invention is related to an electronic component device and a method of manufacturing the same.

BACKGROUND ART

In the prior art, in the semiconductor devices, the improvement of the mounting density have been demanded in order to respond to a requirement of smaller sizes and higher performance. As a means to improve the mounting density, technique have been developed which involve stacking and connecting semiconductor packages in, each of which a semiconductor element is mounted on a wiring substrate.

A related art is disclosed in Japanese Laid-open Patent Publication No. 8-236694 and Japanese Laid-open Patent Publication No. 2002-43506.

In the prior art, since the semiconductor packages in each of which the semiconductor element is mounted on the wiring substrate are stacked, there is a problem that it is not easy to respond to a thinner structure and miniaturization of the wiring layer. Moreover, since the wiring substrates are often formed of resin materials, warp or waviness is easy to be caused by heating processes or the like. For this reason, the reliability of the connection of the semiconductor elements cannot be obtained, sufficiently in some cases.

According to one aspect discussed herein, there is provided an electronic component device, including a plurality of wiring layers each including a component connection pad in a center part and an external connection pad in a periphery of the center part, an insulating layer formed on the wiring layers, the insulating layer in which the component connection pad and the external connection pad are exposed, a frame member arranged on the insulating layer, and the frame member in which an opening portion is provided in an area of the center part in which the component connection pad is arranged, and a connection hole is provided on the external connection pad, an electronic component arranged in the opening portion of the frame member and connected to the component connection pad, a sealing resin formed in the opening portion of the frame member and sealing the electronic component, and a metal bonding material formed on the external connection pad in the connection hole.

Also, according to another aspect discussed herein, there is provided a method of manufacturing an electronic component device, including forcing a plurality of wiring layers on one face of a metal sheet and forming an electrode pad on the other face of the metal sheet, each of the wiring layers including a component connection pad in a center part and an external connection pad in a periphery of the center part, the electrode pad being formed at a position corresponding to the external connection pad, forming an insulating layer on the wiring layers, forming a frame member on the insulating layer, the frame, member in which an opening portion is provided in an area of the center part in which the component connection pad is arranged, formic a connection hole in the insulating layer and the frame member on the external connection pad, and forming a contact hole in the insulating layer on the component connection pad, connecting a connection electrode of an electronic component to the component connection pad through the contact hole, forming a sealing resin in the opening portion of the frame member, the sealing resin sealing the electronic component, forming a metal bonding material in the connection hole and forming a mask metal layer on the electrode pad, and etching the metal sheet by using the mask metal layer as a mask to form a connection terminal.

The object and advantages of the invention will, be realized and attained by means of the elements and combination particularly pointed out in the claims.

It is to be understood that both the foregoing general description and the following detailed description are exemplary and explanatory and are not restrictive of the invention, as claimed.

DESCRIPTION OF EMBODIMENTS

Hereinbelow, embodiments of the present invention will be explained with reference to the accompanying drawings.

FIGS. 1 to 12 are views depicting a method of manufacturing an electronic component device of an embodiment. FIG. 13 is a view depicting an electronic component device of the embodiment. Hereinbelow, while explaining a method of manufacturing the electronic component device, a structure of the electronic component device will be explained.

Figure 1:
FIG. 1 is a cross-sectional view depicting a method of manufacturing an electronic component device of an embodiment (Part 1).

In the method of manufacturing the electronic component device of the embodiment, first, as depicted in FIG. 1, a metal sheet 10 is prepared. The metal sheet 10 is formed of a metal material such as a 42 alloy (iron (Fe)-nickel (Ni) alloy), copper (Cu), Kovar (iron (Fe)-nickel (Ni)-cobalt (Co) alloy), or iron (Fe).

The metal sheet 10 is preferably formed of a material having a relatively low thermal expansion coefficient, in view of which a 42 alloy or Hover is preferably used. The thermal expansion coefficient of a 42 alloy is 4 to 6 ppm/° C., which is a significantly lower value than the thermal expansion coefficient (about 17 ppm/° C.) of glass epoxy resin used as a material of the common wiring substrate. Moreover, the thermal expansion coefficient of Rover is 6 to 7 ppm/° C.

The thickness of the metal sheet 10 is set to 200 μm to 800 μm, for example. The metal sheet 10 of a thin film in a state that is wound around a reel is pulled cut like a belt shape, and various processes are performed on the metal sheet 10 by using a reel-to-reel method. In the case of not employing the reel-to-reel method, the metal sheet 10 which is cut in a rectangle shape is used. The following explanation will be given while assuming that one face of the metal sheet 10 is an upper face and the other face is a lower face.

Figure 2:
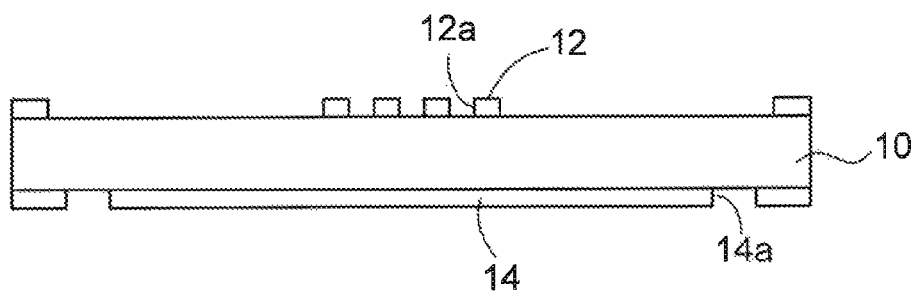
FIG. 2 is a cross-sectional view depicting the method of manufacturing an electronic component device of the embodiment (Part 2).

Then, as depicted in FIG. 2, a permanent resist layer 12 in which opening portions 12a are provided is formed on the upper face of the metal sheet 10 as a first resist layer on the basis of photolithography. The opening portions 12a of the permanent resist layer 12 are formed in a pattern corresponding to a wiring layer.

The permanent resist layer 12 cannot be removed in a subsequent wet processing step and remain in the final product. The thickness of the permanent resist layer 12 is set so as to correspond to the thickness of the wiring layer, and is 10 μm to 20 μm, for example.

Further, as depicted in FIG. 2 similarly, a photoresist layer 14 in which opening portions 14a are provided is formed on the lower face of the metal sheet 10 as a second resist layer on the basis of photolithography. The opening portions 14a of the photoresist layer 14 are formed in a pattern of an island shape corresponding to electrode pads. The thickness of the photoresist layer 14 is 10 μm to 20 μm, for example.

Figure 3:
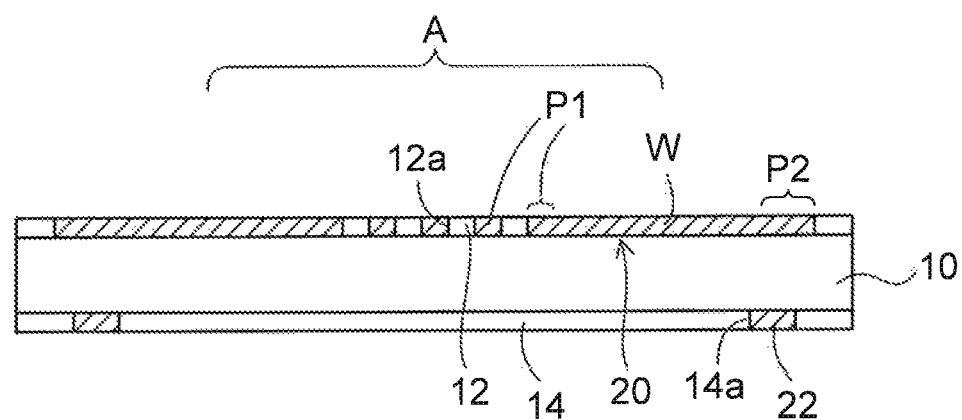
FIG. 3 is a cross-sectional view and a plan view depicting the method of manufacturing an electronic component device of the embodiment (Part 3).
Figure 3:
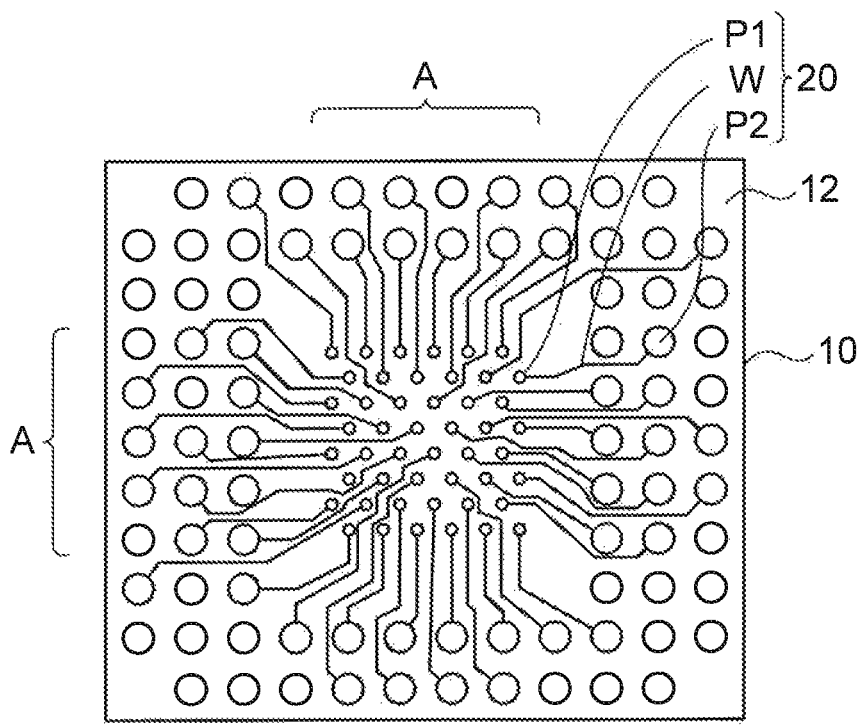

Thereafter, as depicted in FIG. 3, metal plating is applied in the opening portions 12a of the permanent resist layer 12 on the upper side of the metal sheet 10 by electroplating utilizing the metal sheet 10 as a plating power feeding path, thus a wiring layer 20 is formed. Moreover, simultaneously with this, the metal plating is applied in the opening portions 14a of the photoresist layer 14 on the lower side of the metal sheet 10, thus electrode pads 22 are formed.

In the case that the metal sheet 10 is formed of a 42 alloy or iron, the wiring layer 20 and the electrode pads 22 are formed by copper (Cu) electroplating.

Moreover, in the case that the metal sheet 10 is formed of Kovar, the wiring layer 20 and the electrode pads 22 are each formed by the following method. First, a nickel (Ni) strike plating layer whose thickness is 0.1 μm to 0.3 μm is formed by electroplating.

By applying the strike plating, a passivity film on the underlying layer (Kovar) is removed, thereby adhesion of the plating layer can be improved. Thereafter, copper (Cu) electroplating is performed on the nickel (Ni) strike plating layer. By this matter, the wiring layer 20 and the electrode pads 22 are obtained.

Moreover, in the case that the metal sheet 10 is formed of copper (Cu), the wiring layer 20 and the electrode pads 22 are formed by forming a nickel electroplating layer whose thickness is 3 μm to 5 μm and then by performing copper (Cu) electroplating.

Referring to the reduced plan view in FIG. 3 in addition, the wiring layer 20 includes a plurality of component connection pads P1 arranged in a component mount area A in a center part. Further, the wiring layer 20 includes lead-out wiring portions W connected respectively to the component connection pads P1 and extending outward, and external connection pads P2 connected respectively to the outer ends of the lead-out wiring portions W and arranged at the periphery of the component mount area A. The arrangement pitch of the component connection pads P1 is 40 μm to 100 μm, for example.

In this way, on the upper side of the metal sheet 10, a plurality, of wiring layers 20 are formed each of which includes the component connection pad P1 in the center part and the external connection pad P2 at the periphery of the center part.

The electrode pads 22 on the lower side of the metal sheet 10 are arranged respectively at positions corresponding to the external connection pads 22 of the wiring layers 20 on the upper side of the metal sheet 10.

Figure 4:
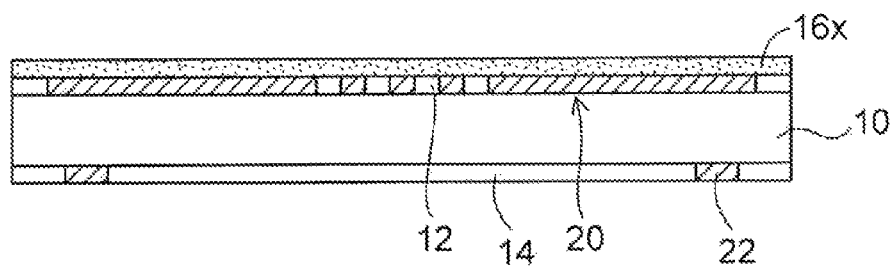
FIG. 4 is a cross-sectional view depicting the method of manufacturing an electronic component device of the embodiment (Part 4).

Then, as depicted in FIG. 4, an uncured resin material 16x such as epoxy resin is formed on the permanent resist layer 12 and the wiring layers 20 on the upper side of the metal sheet 10. The resin material 16x is formed as adhesive resin, a resin film may be attached or liquid resin may be coated.

Figure 5:
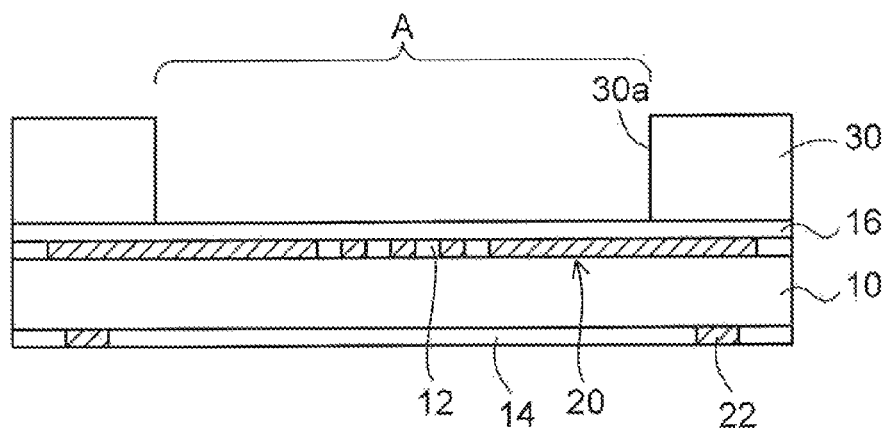
FIG. 5 is a cross-sectional view and a plan view depicting the method of manufacturing an electronic component device of the embodiment (Part 5).
Figure 5:
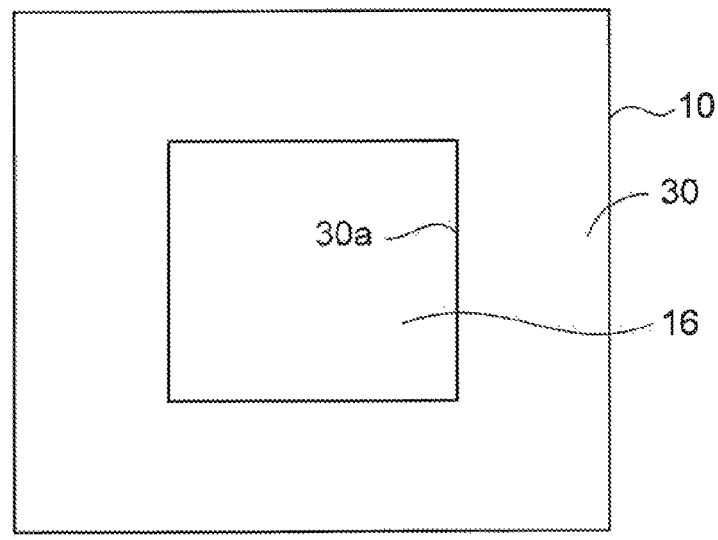

Subsequently, as depicted in FIG. 5, a frame member 30 in which an opening portion 30a is provided in the center is prepared. The opening portion 30a of the frame member 30 is provided to penetrate the frame member 30 in its thickness direction. The frame member 30 is obtained by pouring resin into a mold and then curing the resin.

Alternatively, the frame member 30 may be obtained by forming an opening portion in an uncured resin film by pressing or the like and then curing the resin film. The thickness of the frame member 30 is set to be thicker than the thickness of a semiconductor element to be described later.

Then, the frame member 30 is placed on the resin material 16x such that the opening portion 30a of the frame member 30 is arranged in the component mount area A in which the component connection pads P1 are arranged. Further, a heating process is performed at a temperature of about 200° C., so that the resin material 16x is cured and is made to an insulating layer 16. By this matter, the frame member 30 is fixed to the wiring layers 20 on the metal sheet 10 through the insulating layer 16 by an adhering effect when the resin material 16x is cured.

In the case of employing the reel-to-reel method, the metal sheet 10 on which the frame member 30 is formed cannot be wound around a reel. Therefore, before or after the step of forming the frame member 30, the metal sheet 10 which is pulled out in the belt shape and is conveyed is cut in a rectangle shape.

Meanwhile, in the step of FIG. 2 mentioned above, it may form a commonly used photoresist layer (not depicted) as the first resist layer instead of the permanent, resist layer 12. In this mode, after the wiring layers 20 are formed in the step of FIG. 3, only this photoresist layer on the upper side of the metal sheet 10 may be selectively remove.

Figure 6:
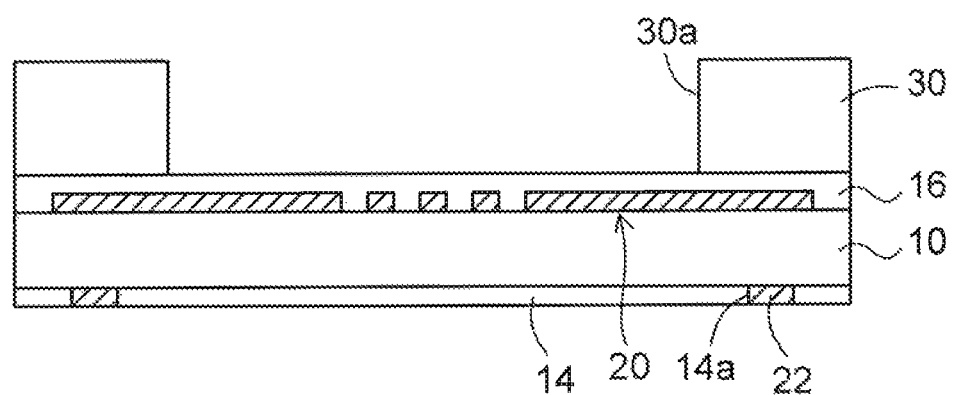
FIG. 6 is a cross-sectional view depicting the method of manufacturing an electronic component device of the embodiment (Part 6).

In the case of employing this method, as depicted in a modification in FIG. 6, the insulating layer 16 is formed from the areas between the wiring layers 20 to an upper side of the wiring layers 20, and the frame member 30 is fixed similarly by the insulating layer 16. The following part of the manufacturing method will be explained to employ the structure body in FIG. 5.

Figure 7:
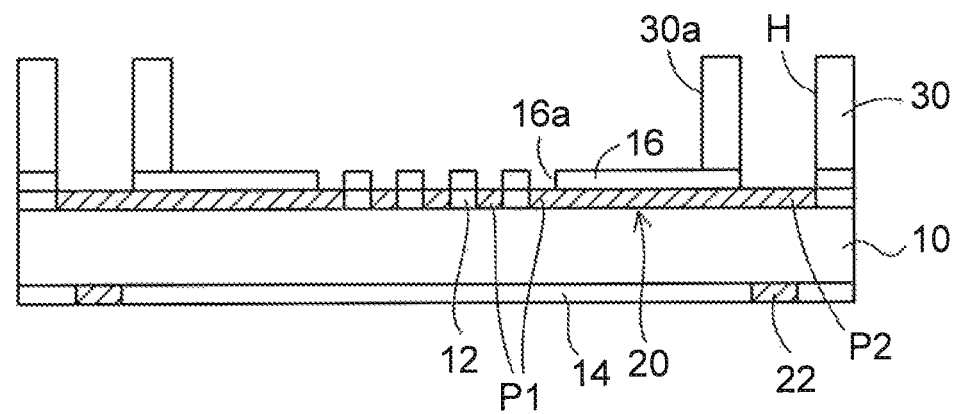
FIG. 7 is a cross-sectional view and a plan view depicting the method of manufacturing an electronic component device of the embodiment (Part 7).
Figure 7:
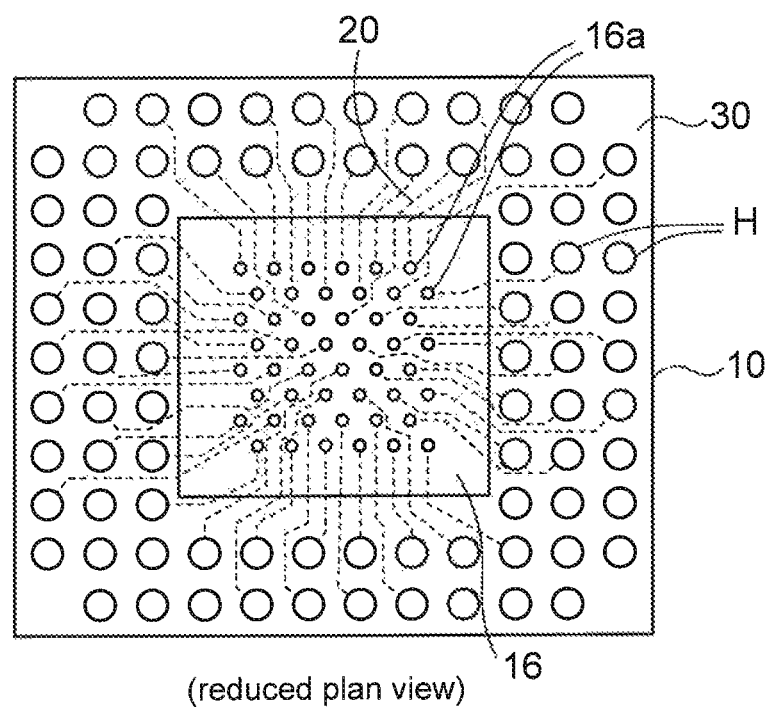

Subsequently, as depicted in FIG. 7, the frame member 30 and the insulating layer 16 thereunder in the structure body in FIG. 5 are processed by a laser to form connection holes H reaching the external connection pads P2. Each connection hole H is formed such that a hole in the frame member 30 is communicated on a hole in the insulating layer 16.

As depicted in the reduced plan view in FIG. 7 the connection holes H are arranged respectively on each of the plurality of external connection pads P2 in the reduced plan view in FIG. 5. The diameter of the connection holes H is set to be one size smaller than the diameter of the external connection pads 22 and is about 300 µm, for example.

Then, as depicted in FIG. 7 similarly, the insulating layer 16 exposed in the opening portion 30a of the frame member 30 is processed by a laser to form contact holes 16a reaching the component connection pads P1 respectively. The diameter of the contact holes 16a is set to be one size smaller than the diameter of the component connection pads P1 and is about 20 µm to 50 µm, for example.

Thereafter, a desmearing process is performed to remove resin smears in the connection holes H and the contact holes 16a to clean them. The desmearing process is performed by plasma etching using a $CF_4/O_2$-based gas. Alternatively, the desmearing process may be performed by a wet process such as a permanganate method.

Dry etching may be used in the steps of forming the connection holes H and the contact holes 16a, instead of using a laser. In the case of employing dry etching, first, the connection holes H are formed in the frame member 30 by performing dry etching through a first metal mask (not depicted) in which opening portions are provided at positions corresponding to the connection holes H.

Then, the contact holes 16a are formed in the insulating layer 16 by performing dry etching through a second metal mask (not depicted) in which opening portions are provided at positions corresponding to the contact holes 16a.

Note that the connection holes H may be formed after the contact holes 16a are formed. Moreover, the connection holes H and the contact holes 16a can each be formed by dry etching using a photoresist layer as a mask, instead of using a metal mask.

Figure 8:
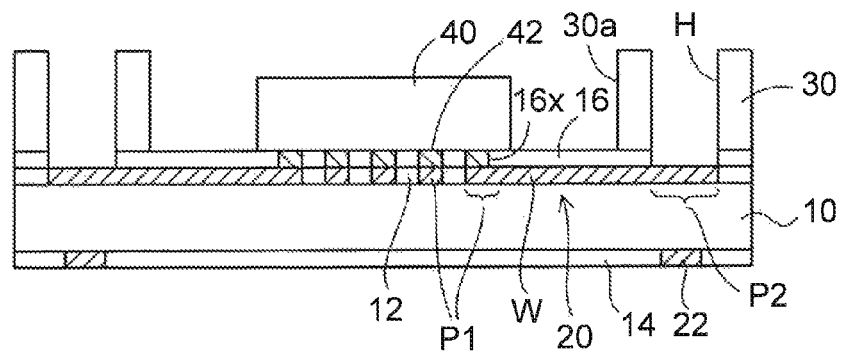
FIG. 8 is a cross-sectional view depicting the method of manufacturing an electronic component device of the embodiment (Part 8).

Thereafter, as depicted in FIG. 8, a semiconductor element 40 including connection electrodes 42 at its lower face is prepared. The connection electrodes 42 of the semiconductor element 40 are formed of solder bumps, gold bumps, or the like. The semiconductor element 40 is an LSI chip such as a CPU chip or a memory chip. Then, the connection electrodes 42 of the semiconductor element 40 are arranged in the contact holes 16a inside the opening portion 30a of the frame member 30 through solder and reflow heating is performed.

By this matter, the connection electrodes 42 of the semiconductor element 40 are flip-chip connected to the component connection pads P1 on the metal sheet 10. The semiconductor element 40 is illustrated as an example electronic component, and various electronic components can be mounted as well. A passive component such as a capacitor may be mounted in an area at a lateral side of the semiconductor element 40.

The height position of the upper face of the frame member 30 is set to be higher than the height position of the upper face of the semiconductor element 40. For example, the thickness of the semiconductor element 40 except the connection electrodes 42 is 500 µm to 750 µm, and the thickness of the frame member 30 is set to be thicker than the thickness of the semiconductor element 40 by about 100 µm to 200 µm.

Figure 9:
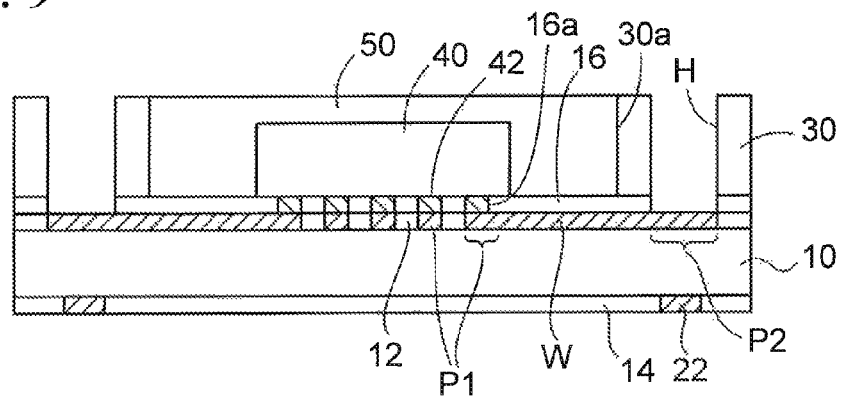
FIG. 9 is a cross-sectional view depicting the method of manufacturing an electronic component device of the embodiment (Part 9).

Then, as depicted in FIG. 9, low-viscosity resin is poured into the opening portion 30a of the frame member 30 by a dispenser or the like and cured by a heating process at a temperature of about 200° C., so that sealing resin 50 sealing the semiconductor element 40 is formed. At this time, the resin is supplied such that the resin does not flow into the connection holes H. Epoxy resin in which a filler such as silica is dispersed is used as an example of the material of the sealing resin 50.

Figure 10:
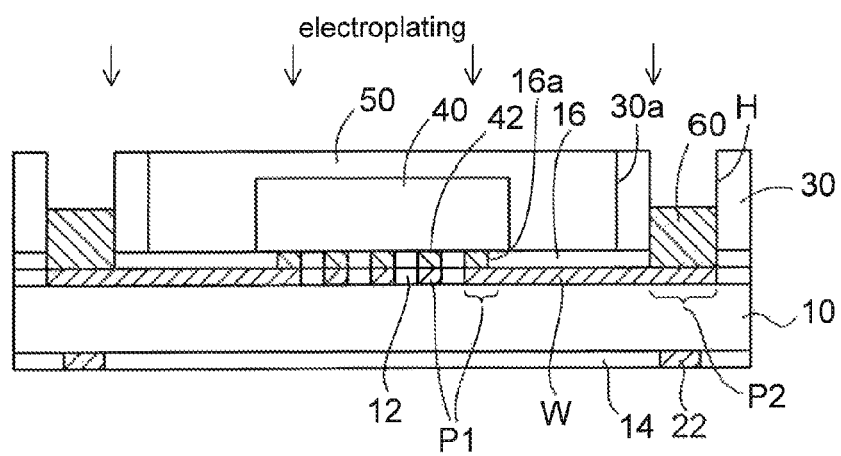
FIG. 10 is a cross-sectional view depicting the method of manufacturing an electronic component device of the embodiment (Part 10).

Thereafter, as depicted in FIG. 10, metal plating is applied from the surface of the external connection pad P2 in each connection hole H toward the upper side by electroplating utilizing the metal sheet 10 as a plating power feeding path. At this time, the metal plating is applied only on the upper side of the metal sheet 10 by jet plating. By this matter, a metal bonding material 60 is formed in each connection hole H, the metal bonding material 60 being connected to the external connection pad P2.

The metal bonding material 60 is formed from the bottom of the connection hole H to a halfway position in the height of the connection hole H. In the example of FIG. 10, the metal bonding material 60 is formed to the half position in the height of the connection hole H.

Figure 11:
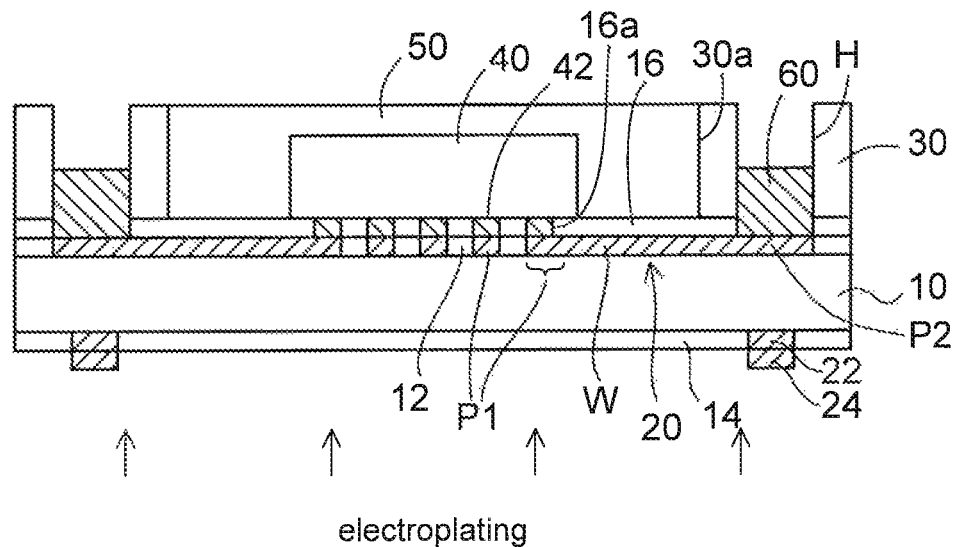
FIG. 11 is a cross-sectional view depicting the method of manufacturing an electronic component device of the embodiment (Part 11).

Then, as depicted in FIG. 11, electroplating is performed on only the lower side of the metal sheet 10 by using similar jet plating. By this matter, a mask metal layer 24 made of the same metal as the metal bonding material 60 is formed on each electrode pad 22.

A low-melting metal is preferably used as the metal bonding material 60. As such a low-melting metal, a lead (Pd) free solder such as Tin (Sn), tin (Sn)/silver (Ag)-based solder, or tin (Sn)/silver (Ag)/copper (Cu)-based solder is used. For example, the melting point of tin is about 260° C.

Note that electroplating may be performed on both sides of the metal sheet 10 simultaneously in the steps of FIGS. 10 and 11 described above. In this case, the following method is employed such that the thickness of the metal bonding material 60 on the upper side of the metal sheet 10 is thicker than the thickness of the mask metal layer 24 on the lower side.

First, in a state that a mask member such as a protection tape is formed on the lower side of the metal sheet 10, a main cart of the metal bonding material 60 is formed on the upper side of the metal sheet 10 by the electroplating. Subsequently, the mask member is removed, and then electroplating is performed on both sides of the metal sheet 10 such that the mask metal layer 24 is formed to the required thickness on the lower side.

Figure 12:
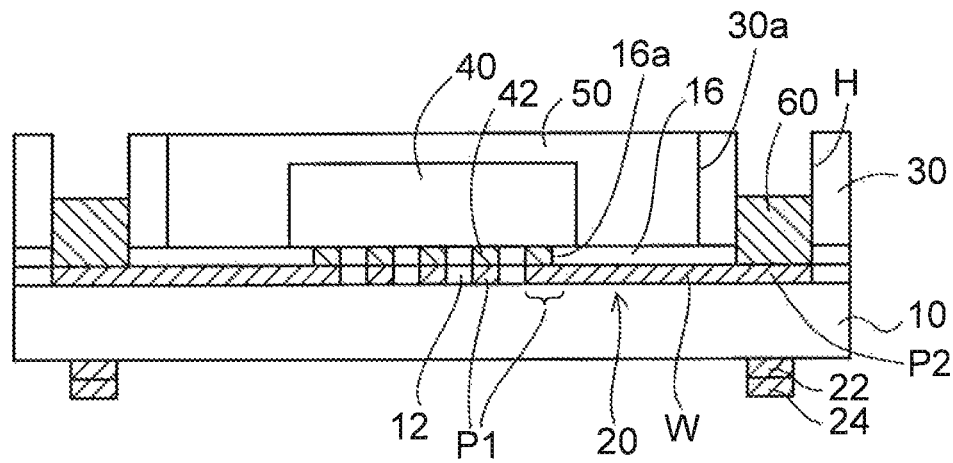
FIG. 12 a cross-sectional view depicting the method of manufacturing an electronic component device of the embodiment (Part 12).
Figure 13:
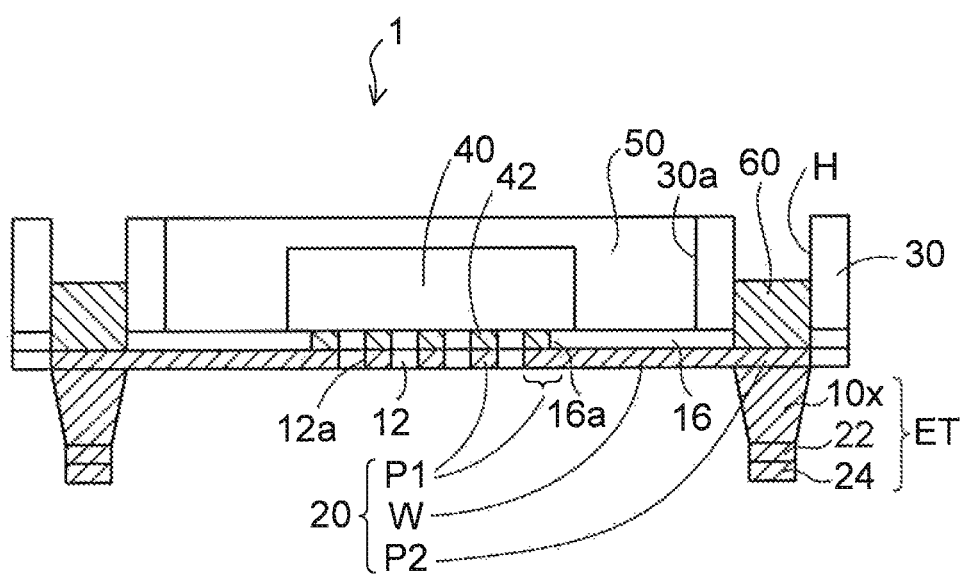
FIG. 13 is a cross-sectional view depicting an electronic component device of the embodiment.

Thereafter, as depicted in FIG. 12, the photoresist layer 14 on the lower side of the metal sheet 10 is removed by resist stripping solution, so that the metal sheet 10 is exposed.

Then, as depicted in FIG. 13, by using the mask metal layer 24 on the lower side of the metal sheet 10 as a mask, the exposed metal sheet 10 is etched until the lower faces of the wiring layers 20 and the permanent resist layer 12 are exposed. At this time, spray etching is employed in which the metal sheet 10 is etched by spraying etching solution thereto through a spray nozzle. In this way, the metal sheet 10 is etched under a condition similar to anisotropic etching.

By this matter, the metal sheet 10 is patterned and protruding electrodes 10x protruding downward are obtained. The electrode pads 22 and the mask metal layers 24 are arranged on the lower faces of the protruding electrodes 10x.

An external connection terminal ET is formed from the protruding electrode 10x, the electrode pad 22, and the mask metal layer 24. In this way, the external connection terminals ET connected to the lower faces of the external connection pads P2 are obtained.

In the case that the metal sheet 10 is formed of a 42 alloy, a hydrogen peroxide ($H_2O_2$) ammonia ($NH_4$)/hydrofluoric acid (HF)-based etching solution is used, and the metal sheet 10 made of the 42 alloy can be etched selectively to the mask metal layers 24 (tin or the like) and the wiring layers 20 (copper).

Moreover, in the case that the metal sheet 10 is formed of Kovar, a $H_2O_2$/HF-based etching solution is likewise used, and the metal sheet 10 made of Kovar can be etched selectively to the mask metal layers 24 (tin or the like) and the wiring layers 20 (copper).

Further, in the case that the metal sheet 10 is formed of copper, an alkaline etching solution containing an organic acid and an amine-based complexing agent is used, and the metal sheet 10 made of copper can be etched selectively to the mask metal layers 24 (tin or the like) and the wiring layers 20 (including a nickel layer on the lowermost, side). Alternatively, in the case that the metal sheet 10 is formed of copper, an alkaline etching solution containing copper ammonia complex may be used.

Furthermore, in the case that the metal sheet 10 is formed of iron, a hydrogen chloride (HCl)-based etching solution is used, and the metal sheet 10 made of iron can be etched selectively to the mask metal layers 24 (tin or the like) and the wiring layers 20 (copper).

Note that side etching can be suppressed by employing a jet etching method using an etching solution which forms a protection film on etching side faces during the wet etching. In this way, it is possible to obtain a shape more similar to a shape obtained by anisotropic etching.

By the above steps, an electronic component device 1 of the embodiment is obtained. As depicted in FIG. 13, the electronic component device 1 of this embodiment includes the wiring layers 20 in which it is in a state that lower faces of the wiring layers 20 are exposed to the ambient air. Each wiring lever 20 includes the component connection pad P1 in the center part and the external connection pad P2 at the periphery of the center part. The component connection pad P1 is connected to the external connection pad P2 through the lead-out wiring portion W. The permanent resist layer 12 is arranged in the areas between a plurality of the wiring layers 20.

The frame member 30 is arranged on the wiring layers 20 through the insulating layer 16 which functions as an adhesive layer. In the case of employing the structure in FIG. 6 mentioned above, such structure is constructed that the permanent resist layer 12 is omitted and the insulating layer 16 is formed between the wiring layers 20 as well.

The contact holes 16a are formed in the insulating layer 16 on the component connection pads P1. The connection electrodes 42 of the semiconductor element 40 are flip-chip connected to the component connection pads P1 through the contact holes 16a.

Further, the frame member 30 is arranged on the periphery part of the wiring layers 20 and the insulating layer 16. The frame member 30 is provided with the opening portion 30a in the center part and arranged like a ring shape so as to surround the semiconductor element 40. The height of the frame member 30 is set to be higher than the height of the semiconductor element 40.

Moreover, the sealing resin 50 is filled in the opening portion 30a of the frame member 30 and seals the whole of the semiconductor element 40.

Moreover, the connection holes H are formed in the frame member 30 and the insulating layer 16 thereunder and reach the plurality of external connection pads P2 respectively. Thus, the insulating layer 16 is formed between the wiring layers 20 and the frame member 30 while exposing the component connection pads P1 and the external connection pads P2.

The metal bonding material 60 is formed on the external connection pad P2 in each connection hole H to the halfway position within the height of the connection hole H, and the metal bonding material 60 is connected to the external connection pad P2.

The external connection terminal ET protruding downward is provided under each external connection pad P2. The external connection terminal ET is formed of the protruding electrode 10x connected to the lower face of the external connection pad P2, and the electrode pad 22 and the mask metal layer 24 arranged thereunder.

The electronic component device 1 of this embodiment does not include any core substrate made of place epoxy resin or the like, but is structured such that the semiconductor element 40 arranged on the wiring layers 20 and the insulating layer 16 is housed in the opening portion 30a of the frame member 30 and sealed with the sealing resin 50. Therefore, the structure can be made to a thinner type than the case that the core substrate is used.

Moreover, the wiring layers 20 are formed in the opening portions 12a of the permanent resist layer 12 collectively by electroplating utilizing the metal sheet 10 as a plating power feeding path. Therefore, the fine wiring layers 20 can be formed at a good yield corresponding to the actual performance of the photolithography.

Furthermore, in this embodiment, the semiconductor element 40 is flip-chip connected to the component connection pads P1 of the wiring layers 20 formed on the metal sheet 10. Since the metal sheet 10 is formed of a metal material having a low thermal expansion coefficient, even when a heating process is repeatedly performed in the manufacturing process, thermal stress is not generated inside the metal sheet 10 and warp or waviness is hardly caused.

For this reason, the flatness of the mounting area for the semiconductor element 40 can be secured as compared to a case that a resin substrate is used. Therefore, the semiconductor element 40 can be reliably flip-chip connected to the component connection pads P1.

Moreover, the wiring layers 20 or the like can be formed on the metal sheet 10 which is the thin film, by utilizing the existing facilities in the reel-to-reel system used in a process of manufacturing lead frames. Thus, the production efficiency can be improved, and the cost reduction can be achieved.

Next, a method of manufacturing a staked electronic component device by stacking a plurality of the electronic component devices 1 of the embodiment in FIG. 13 will be explained.

Figure 14:
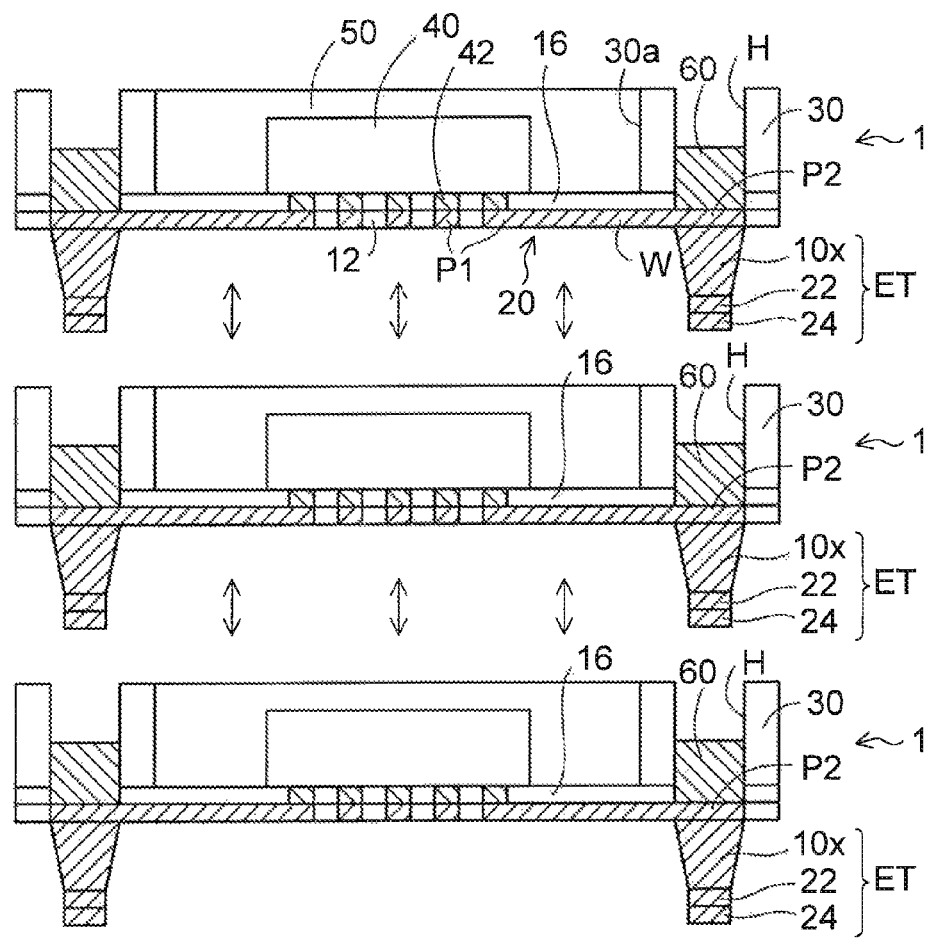
FIG. 14 is a cross-sectional view depicting a state that the electronic component devices of the embodiment are stacked.

As depicted in FIG. 14, a plurality of the electronic component devices 1 in FIG. 13 are prepared. Then, the plurality of electronic component devices 1 are stacked such that the external connection terminals ET of the electronic component device 1 located to the upper side are arranged on the metal bonding materials 60 in the connection holes H of the electronic component device 1 located to the lower side.

Figure 15:
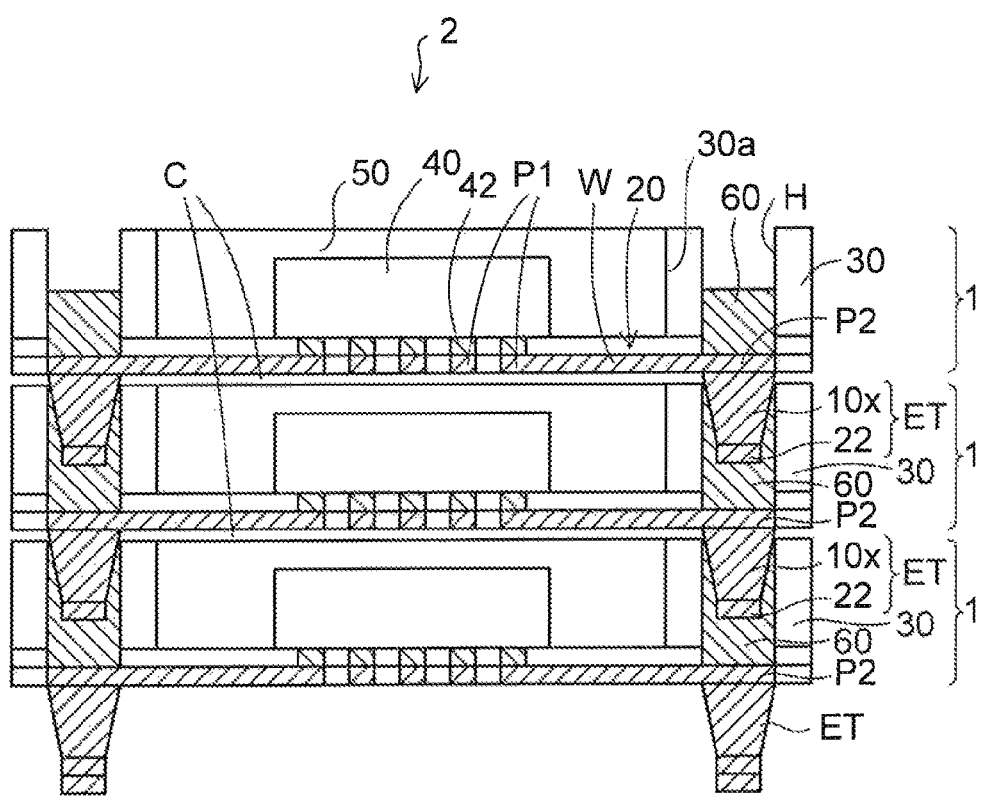
FIG. 15 is a cross-sectional view depicting a stacked electronic component device obtained by stacking the electronic component devices in FIG. 13.

Subsequently, as depicted in FIG. 15, while the stacked electronic component devices are heated at a temperature of about 300° C., the stacked electronic component devices 1 are pressed downward by a pressing jig (not depicted). At this time, the metal bonding materials 60 in the connection holes H of each electronic component device 1 melt, so that the external connection terminals ET of the upper electronic component device 1 are buried in and bonded to the metal bonding materials 60 of the lower electronic component device 1.

The mask metal layers 24 at the tips of the external connection terminals ET are formed of the same metal as the metal bonding materials 60. Thus, it is in a state that the mask metal layers 24 also melt and is integrated with the metal bonding materials 60.

When the external connection terminal ET of the upper electronic component device us bonded to the metal bonding material 60 in the connection hole H of the lower electronic component device 1, the amount of the metal bonding material 60 is adjusted such that the metal bonding material 60 which melts does not overflow from the connection hole H.

Since the connection hole H is arranged on each of the many external connection pads P2, leakage of the metal bonding materials 60 in a lateral direction is prevented. Therefore, even when the pitch of the external connection pads P2 is narrowed, a short circuit between plural external connection pads P2 can be prevented.

By the above steps, a stacked electronic component device 2 is obtained. In the stacked electronic component device 2 in FIG. 15, it is in a state that a clearance C is generated between the upper and lower electronic component devices 1.

Figure 16:
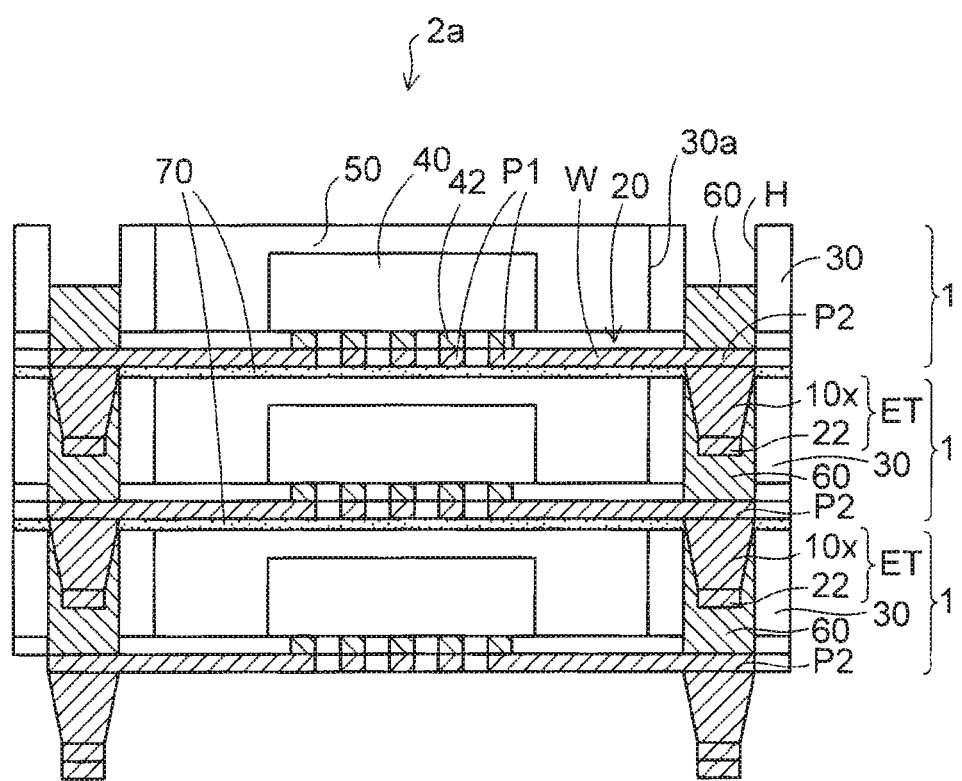
FIG. 16 is a cross-sectional view depicting a state that an insulating layer is formed between each of the electronic component devices, in the stacked electronic component device in FIG. 15.

Like a stacked electronic component device 2a depicted in FIG. 16, an insulating layer 70 made of insulating resin or the like may be filled in the clearance C between the upper and lower electronic component devices 1 in FIG. 15.

In the case of manufacturing the stacked electronic component device 2a in FIG. 16, in the step of FIG. 14 mentioned above, each electronic component device 1 may be stacked in a state that uncured resin is formed on the sealing resin 50 of the electronic component device 1 excluding the connection holes H. The uncured resin between the upper and lower electronic component devices 1 can be cured simultaneously by the heating process for melting the metal bonding materials 60.

In the stacked electronic component devices 2, 2a in FIGS. 15 and 16, the connection terminals ET of the lowermost electronic component device 1 are connected to connection electrodes of a mounting substrate such as a motherboard.

Other Embodiments

Figure 17:
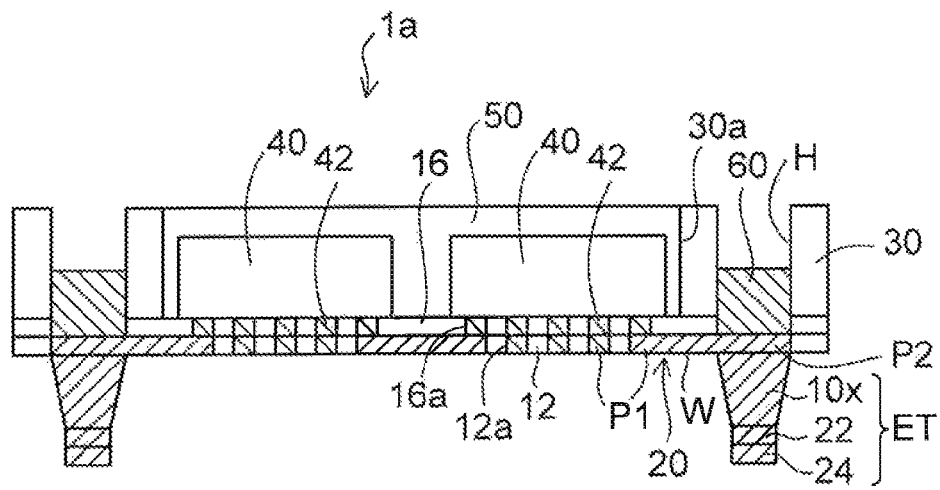
FIG. 17 is a cross-sectional view depicting an electronic component device of a first modification of the embodiment.

Like an electronic component device 1a of a first modification depicted in FIG. 17, a plurality of semiconductor elements 40 may be mounted side by side to the lateral direction inside the opening portion 30a of the frame member 30. Identical semiconductor elements 40 may be mounted side by side to the lateral direction, or different semiconductor elements such as a combination of a CPU and a memory may be mounted side by side to the lateral direction. Alternatively, a semiconductor element and a passive element such as a capacitor may be mounted side by side to the lateral direction.

Figure 18:
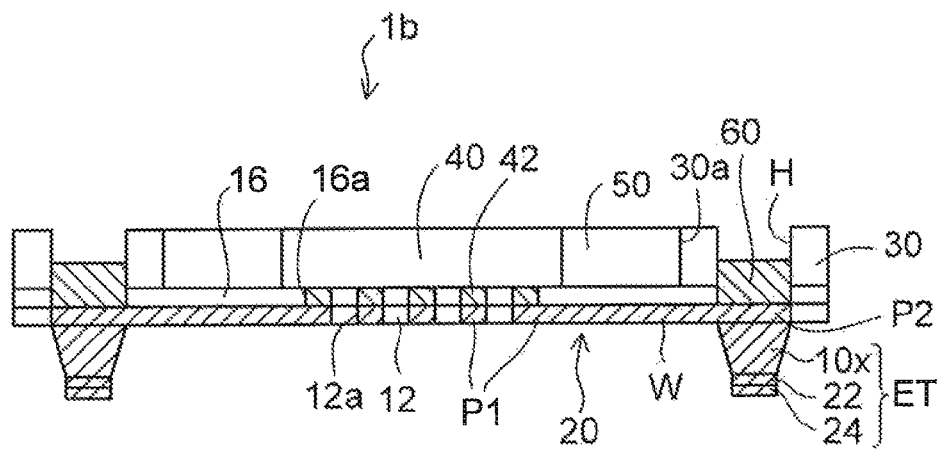
FIG. 18 is a cross-sectional view depicting an electronic component device of a second modification, of the embodiment.

Moreover, like an electronic component device 1b of a second modification depicted in FIG. 18, the sealing resin 50, the semiconductor element 40, and the frame member 30 may be ground to expose the back face of the semiconductor element 40. By this matter, the thickness of the electronic component device 1b can be thinned. For example, the sealing resin 50, the semiconductor element 40, and the frame member 30 are processed such that the thickness of the semiconductor element 40 is set to 50 µm to 30 µm.

In the case of manufacturing the electronic component device 1b of the second modification in FIG. 18, the back face of the semiconductor element 40 is exposed by grinding the sealing resin 50, the semiconductor element 40, and the frame member 30 mostly by a grinder, and thereafter polishing this surface by CMP as finishing. The polishing of the semiconductor element 40 or the like is performed at a predetermined step after the step of forming the sealing resin 50 (FIG. 9) but before the step of etching the metal sheet 10 (FIG. 13).

Figure 19:
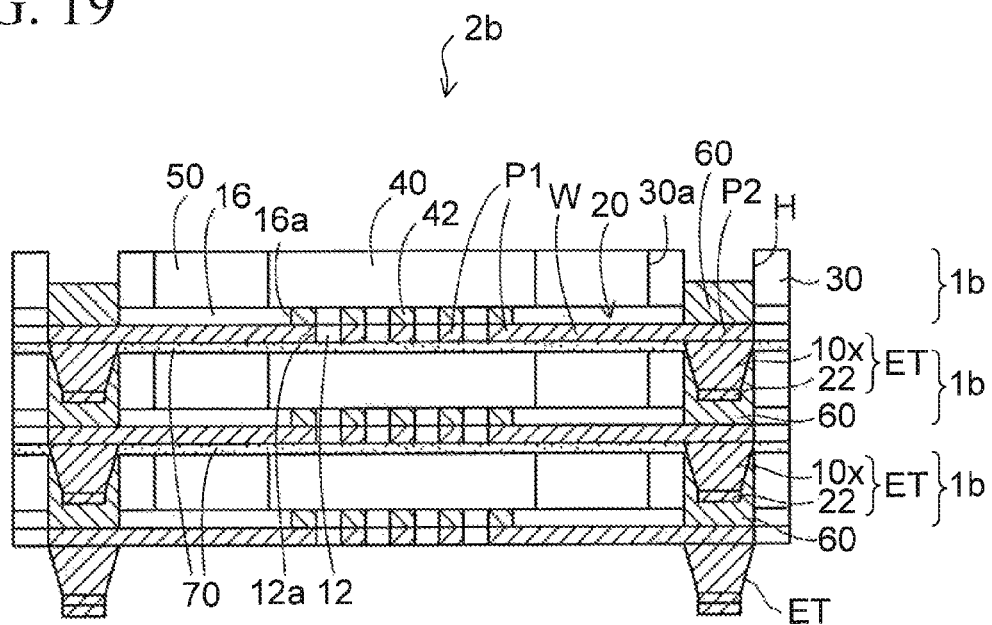
FIG. 19 is a cross-sectional view depicting a stacked, electronic component device obtained by stacking the electronic component devices of the second modification in FIG. 18.

FIG. 19 depicts a stacked electronic component device 2b in which a plurality of the electronic component devices 1b in FIG. 12 are stacked. As depicted in FIG. 19, by stacking the thin type electronic component devices 1b in FIG. 18 through the insulating layer 70 made of a resin material similarly, a thin type stacked electronic component device 2b can be obtained.

Figure 20:
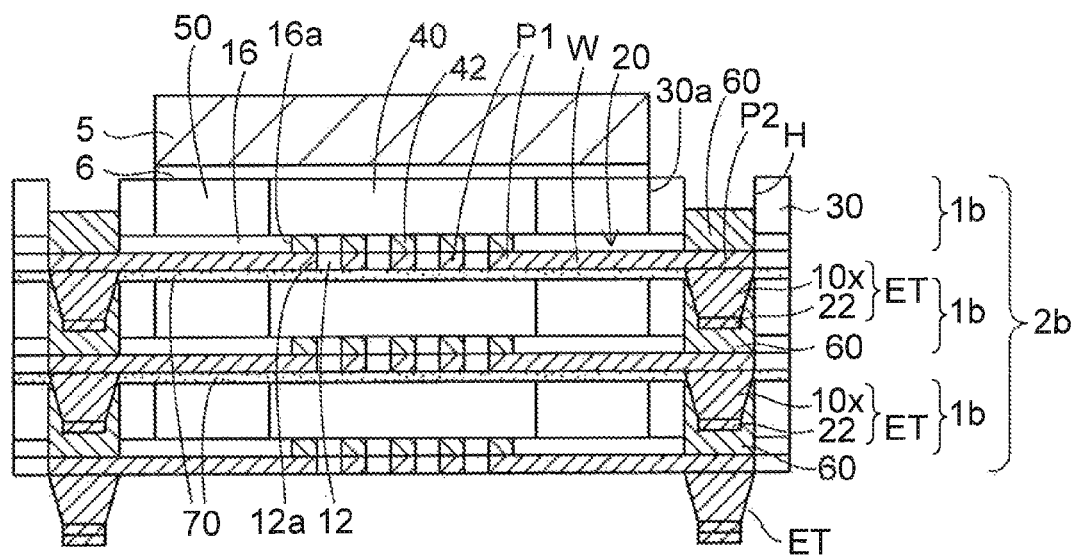
FIG. 20 is a cross-sectional view depicting a state that a heat sink is provided on the uppermost electronic component, in the stacked electronic component device in FIG. 19.

Moreover, as depicted in FIG. 20, a heat sink 5 made of copper or the like may be arranged to be connected to the upper face of the uppermost semiconductor element 40 of the stacked electronic component device 2b in FIG. 19 by a thermally conductive adhesive 6. By this matter, in the case that the uppermost semiconductor element 40 is a CPU chip or the Like which generates the heat easily, its heat can be efficiently released to the outside through the heat sink 5.

All examples and conditional language recited herein are intended for pedagogical purpose to aid the reader in understanding the invention and the concepts contributed by the inventor to furthering the art, and are to be construed as being without limitation to such specifically recited examples and conditions, nor does the organization of such examples in the specification relates to a showing of the superiority and interiority of the invention. Although the embodiments of the present invention have been described in detail, it should be understood that the various changes, substitutions, and alterations could be made hereto without departing from the spirit and scope of the invention.

Further, the clauses are disclosed about the above embodiment hereinafter.

(Clause 1) A method of manufacturing an electronic component device, comprising:

forming a plurality of wiring layers on one face of a metal sheet and forming an electrode pad on the other face of the metal sheet, each of the wiring layers including a component connection pad in a center part and an external, connection pad in a periphery of the center part, the electrode pad being formed at a position corresponding to the external connection pad;

forming an insulating layer on the wiring layers;

forming a frame member on the insulating layer, the frame member in which an opening portion is provided in an area of the center part in which the component connection pad is arranged;

forming a connection hole in the insulating layer and the frame member on the external connection pad, and forming a contact hole in the insulating layer on the component connection pad;

connecting a connection electrode of an electronic component to the component connection pad through the contact hole;

forming a sealing resin in the opening portion of the frame member, the sealing resin sealing the electronic component;

forming a metal bonding material in the connection hole and forming a mask metal layer on the electrode pad; and etching the metal sheet by using the mask metal layer as a mask to form a connection terminal.

(Clause 2) The method of manufacturing an electronic component device according to Clause 1, wherein the forming of the wiring layers and the electrode pad includes forming a first resist layer in which first opening portions are provided, on the one face of the metal sheet, and forming a second resist layer in which a second opening portion is provided, on the other face of the metal sheet, and forming the wiring layers in the first opening portions and forming the electrode pad in the second opening portion by electroplating, after the forming of the mask metal layer, comprising removing the second resist layer, and the forming of the metal bonding material and the mask metal layer is performed by electroplating.

(Clause 3) The method of manufacturing an electronic component device according to Clause 1, after the forming of the sealing resin, comprising exposing the electronic component by grinding the sealing resin, the electronic component, and the frame member.

(Clause 4) The method of manufacturing an electronic component device according to Clause 1, wherein the metal bonding material is any one of tin, tin/silver-based solder, and tin/silver/copper-based solder.

(Clause 5) A method of manufacturing a stacked electronic component device, comprising:

preparing a plurality of electronic component devices by using a manufacturing method including forming a plurality of wiring layers on one face of a metal sheet and forming an electrode pad on the other face of the metal sleet, each of the wiring layers including a component connection pad in a center part and an external, connection pad in a periphery of the center part, the electrode pad being formed at a position corresponding to the external connection pad, forming an insulating layer on the wiring layers, forming a frame member on the insulating layer, the frame member in which an opening portion is provided in an area of the center part in which the component connection pad is arranged, forming a connection hole in the insulating layer and the frame member on the external connection pad, and forming a contact hole in the insulating layer on the component connection pad, connecting a connection electrode of an electronic component to the component connection pad through the contact hole, forming a sealing resin in the opening portion of the frame member, the sealing resin, sealing the electronic component, forming a metal bonding material in the connection hole and forming a mask metal layer on the electrode pad, and etching the metal sheet by using the mask metal layer as a mask to form a connection terminal;

thereafter burying the connection terminal of the electronic component device located to an upper side into the metal bonding material of the electronic component device located to lower side and connecting both.

What is claimed is:

1. An electronic component device, comprising:
    a plurality of wiring layers each including a component connection pad in a center part and an external connection pad in a periphery of the center part;
    an insulating layer formed on an upper face of the wiring layers, the insulating layer having a first hole arranged on the component connection pad and a second hole arranged on the external connection pad;
    a frame member arranged on the insulating layer, and the frame member in which an opening portion is provided in an area of the center part in which the component connection pad is arranged, and a third hole is provided on the second hole on the external connection pad, wherein a connection hole is formed from the second hole and the third hole;
    an electronic component arranged in the opening portion of the frame member and connected to the component connection pad;
    a sealing resin formed in the opening portion of the frame member and sealing the electronic component; and
    a metal bonding material formed on the external connection pad in the connection hole, wherein the metal bonding material is formed to a halfway position in a height of the connection hole, and an upper part side of the connection hole is a cavity.

2. The electronic component device according to claim 1, further comprising a connection terminal formed under the external connection pad.

3. The electronic component device according to claim 1, wherein the metal bonding material is any one of tin, tin/silver-based solder, and tin/silver/copper-based solder.

4. The electronic component device according to claim 1, wherein side faces of the electronic component are sealed by the sealing resin, and an upper face of the electronic component is exposed from the sealing resin.

5. A stacked electronic component device, comprising:
    a plurality of electronic component devices each including:
        a plurality of wiring layers each including a component connection pad in a center part and an external connection pad in a periphery of the center part;
        an insulating layer formed on an upper face of the wiring layers, the insulating layer having a first hole arranged on the component connection pad, and a second hole arranged on the external connection pad;
        a frame member arranged on the insulating layer, and the frame member in which an opening portion is provided in an area of the center part in which the component connection pad is arranged, and a third hole is provided on the second hole on the external connection pad, wherein a connection hole is formed from the second hole and the third hole;
        an electronic component arranged in the opening portion of the frame member and connected to the component connection pad;
        a sealing resin formed in the opening portion of the frame member and sealing the electronic component;

a metal bonding material formed on the external connection pad in the connection hole; and a connection terminal formed under the external connection pad;

wherein the stacked electronic component device is constructed by stacking the plurality of electronic component devices; and the connection terminal of the electronic component devices located to an upper side is buried in and bonded to the metal bonding material of the electronic component device located to a lower side, and the metal bonding material of the electronic component device located in an uppermost position is formed to a halfway position in a height of the connection hole, and an upper part side of the connection hole is a cavity.

6. The electronic component device according to claim 1, a substrate does not exist under the plurality of wiring layers, under faces of the plurality of wiring layers are exposed.

7. The stacked electronic component device according to claim 5, a substrate does not exist under the plurality of wiring layers of the electronic component device located in a lowermost position, under faces of the plurality of wiring layers of the electronic component device located in the lowermost position are exposed.

* * * * *